(12) United States Patent
Pu et al.

(10) Patent No.: US 9,391,197 B1
(45) Date of Patent: Jul. 12, 2016

(54) SEMICONDUCTOR DEVICE AND OPERATING METHOD THEREOF

(71) Applicant: UNITED MICROELECTRONICS CORPORATION, Hsinchu (TW)

(72) Inventors: Shih Chieh Pu, New Taipei (TW); Ming-Tsung Lee, Luodong Township (TW); Cheng-Hua Yang, Hsinchu (TW); Nien-Chung Li, Hsinchu (TW); Wen-Fang Lee, Hsinchu (TW); Chih-Chung Wang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/823,880

(22) Filed: Aug. 11, 2015

(30) Foreign Application Priority Data

Jun. 10, 2015 (CN) .......................... 2015 1 0315077

(51) Int. Cl.
| | | |
|---|---|---|
| *H01L 29/06* | (2006.01) | |
| *H01L 29/78* | (2006.01) | |
| *H01L 29/10* | (2006.01) | |
| *H01L 29/08* | (2006.01) | |

(52) U.S. Cl.
CPC ........ *H01L 29/7823* (2013.01); *H01L 29/0619* (2013.01); *H01L 29/0653* (2013.01); *H01L 29/0865* (2013.01); *H01L 29/0882* (2013.01); *H01L 29/1095* (2013.01)

(58) Field of Classification Search
CPC ............ H01L 29/0619; H01L 29/0653; H01L 29/0865; H01L 29/7823
See application file for complete search history.

(56) References Cited

U.S. PATENT DOCUMENTS

| | | | |
|---|---|---|---|
| 6,507,085 B2* | 1/2003 | Shimizu .............. | H01L 27/0629 257/481 |
| 6,750,489 B1 | 6/2004 | Merrill | |
| 6,833,586 B2 | 12/2004 | Tsuchiko | |
| 7,667,268 B2* | 2/2010 | Disney ................ | H01L 29/0638 257/335 |
| 8,941,188 B2* | 1/2015 | Willmeroth ........... | H01L 29/732 257/401 |

* cited by examiner

Primary Examiner — Jeffrey Zweizig
(74) Attorney, Agent, or Firm — Ding Yu Tan

(57) ABSTRACT

A semiconductor device includes a substrate; a deep well region disposed in the substrate; an element region disposed in the substrate and in the deep well region; a drain region disposed in the substrate, in the deep well region, and surrounding the element region; a gate structure disposed on the surface of the substrate, adjacent to the deep well region, and surrounding the drain region; a well region disposed in the substrate, in the deep well region, and surrounding the gate structure; a source region disposed in the substrate, in the well region, and surrounding the gate structure; a body contact region disposed separately from the source region in the well region and surrounding the source region; and an annular doped region disposed separately from the deep well region in the substrate and surrounding the deep well region.

22 Claims, 5 Drawing Sheets

SEMICONDUCTOR DEVICE AND OPERATING METHOD THEREOF

FIELD OF THE INVENTION

The present invention relates to a semiconductor device, and more particularly to a high-voltage-side semiconductor device having built-in bootstrap diode functions and to an operating method of the high-voltage-side semiconductor device.

BACKGROUND OF THE INVENTION

Technological advancements along with the rapid development of the semiconductor integrated circuit (IC) industry reflect on the application and design of IC materials, leading to emerging products with miniature volume and complex structure. A smart power IC may include multiple power devices, such as high-voltage transistor and high-power transistor, and control circuits, such as low-voltage transistor and low-powered transistor, on a single wafer. Consequently, disposition of a guard ring on high-voltage-side regions and improving capacity and stability of the guard ring have become important issues for the design of IC wafers.

To ensure safety and no interference to devices other than the high-voltage-side region, the guard ring must be capable of isolating the high-voltage-side region from other devices effectively while possessing excellent voltage reduction capability and long-term stability. Therefore, the inventors have routinely tested semiconductor devices by using 1000 hours (hrs) of high temperature reverse bias reliability (HTRB) test. However, the inventors have found that existing guard rings were incapable of sustaining even 500 hours under 700V in the HTRB test. As a result, under limited size alteration, the present invention aims to provide a guard ring with high voltage sustainability and improved stability.

SUMMARY OF THE INVENTION

The present invention provides a high-voltage-side semiconductor device including a substrate having a first surface; a deep well region disposed in the substrate; an element region disposed in the substrate and in the deep well region; a drain region disposed in the substrate, in the deep well region, and surrounding the element region; a gate structure disposed on the first surface of the substrate, adjacent to the deep well region, and surrounding the drain region; a well region disposed in the substrate, in the deep well region, and surrounding the gate structure; a source region disposed in the substrate, in the well region, and surrounding the gate structure; a body contact region disposed separately from the source region in the well region and surrounding the source region; and an annular doped region disposed separately from the deep well region in the substrate and surrounding the deep well region.

In a preferred embodiment of the present invention, the drain region includes a lightly doped drain region surrounding the element region, and a drain contact region disposed in the lightly doped drain region.

In a preferred embodiment of the present invention, the high-voltage-side semiconductor device further includes a plurality of isolation structures, disposed between the element region and the drain region.

In a preferred embodiment of the present invention, the high-voltage-side semiconductor device further includes a deep well isolation region disposed in the substrate, adjacent to and beneath the deep well region, and located below the element region.

In a preferred embodiment of the present invention, the high-voltage-side semiconductor device further includes a top well region disposed in the deep well region and covered by the gate structure.

In a preferred embodiment of the present invention, the top well region is annular and surrounding the drain region.

In a preferred embodiment of the present invention, the top well region is in contact with the gate structure.

In a preferred embodiment of the present invention, the top well region is separated from the gate structure.

In a preferred embodiment of the present invention, the source region includes a doped source region, and a source contact region disposed in the doped source region.

In a preferred embodiment of the present invention, the doped source region and the source contact region are annular and surrounding the gate structure.

In a preferred embodiment of the present invention, the source region and the body contact region are separated by an isolation structure.

In a preferred embodiment of the present invention, the body contact region includes a lightly doped body contact region, and a doped body contact region disposed in the lightly doped body contact region.

In a preferred embodiment of the present invention, the lightly doped body contact region and the doped body contact region are annular and surrounding the gate structure.

In a preferred embodiment of the present invention, the annular doped region includes an annular lightly doped region, an annular doped region disposed in the annular lightly doped region, and an annular contact region disposed in the annular doped region.

In a preferred embodiment of the present invention, the high-voltage-side semiconductor device further includes a peripheral deep well region disposed in the deep well region and adjacent to the well region and surrounding the well region.

The present invention also provides an operating method for a semiconductor device, wherein the semiconductor device comprises a substrate having a first surface, a deep well region disposed in the substrate, an element region disposed in the substrate and in the deep well region, a drain region disposed in the substrate, in the deep well region, and surrounding the element region, a gate structure disposed on the first surface of the substrate, adjacent to the deep well region, and surrounding the drain region, a well region disposed in the substrate, in the deep well region, and surrounding the gate structure, a source region disposed in the substrate, in the well region, and surrounding the gate structure, a body contact region disposed separately from the source region in the well region and surrounding the source region, and an annular doped region disposed separately from the deep well region in the substrate and surrounding the deep well region, comprising the steps of providing a ground voltage for the body contact region and the annular doped region; providing the ground voltage or a first power supply voltage for the source region and the gate structure; and providing a second power supply voltage for the drain region or configuring the drain region into a floating state.

In a preferred embodiment of the present invention, the ground voltage is provided for the source region and the gate structure, and the second power supply voltage is provided for the drain region.

In a preferred embodiment of the present invention, the second power supply voltage ranges between 500-800V.

In a preferred embodiment of the present invention, the first power supply voltage is provided for the source region and the gate structure, and the drain region is in the floating state.

In a preferred embodiment of the present invention, the first power supply voltage ranges between 0-30V.

In a preferred embodiment of the present invention, the drain region produces a positive voltage lower than the first power supply voltage when the first power supply voltage is provided to the source region and the gate structure and the drain region is in a floating state.

According to the semiconductor device and its operating method of the present invention as provided above, the semiconductor device can be a high-voltage-side device when configured into an off-state and provides high voltage sustainability and stability, which improves upon existing issues encountered in prior arts and does not result in size alteration. On the other hand, the semiconductor device can possess built-in bootstrap diode function when configured into an on-state, therefore integrating bootstrap diode functions into the device.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a semiconductor device. The device may provide high voltage sustainability and stability and better protection when used as a high-voltage-side semiconductor device without increasing the size of the product. The semiconductor device may also integrate bootstrap diode functions when provided with different voltages. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
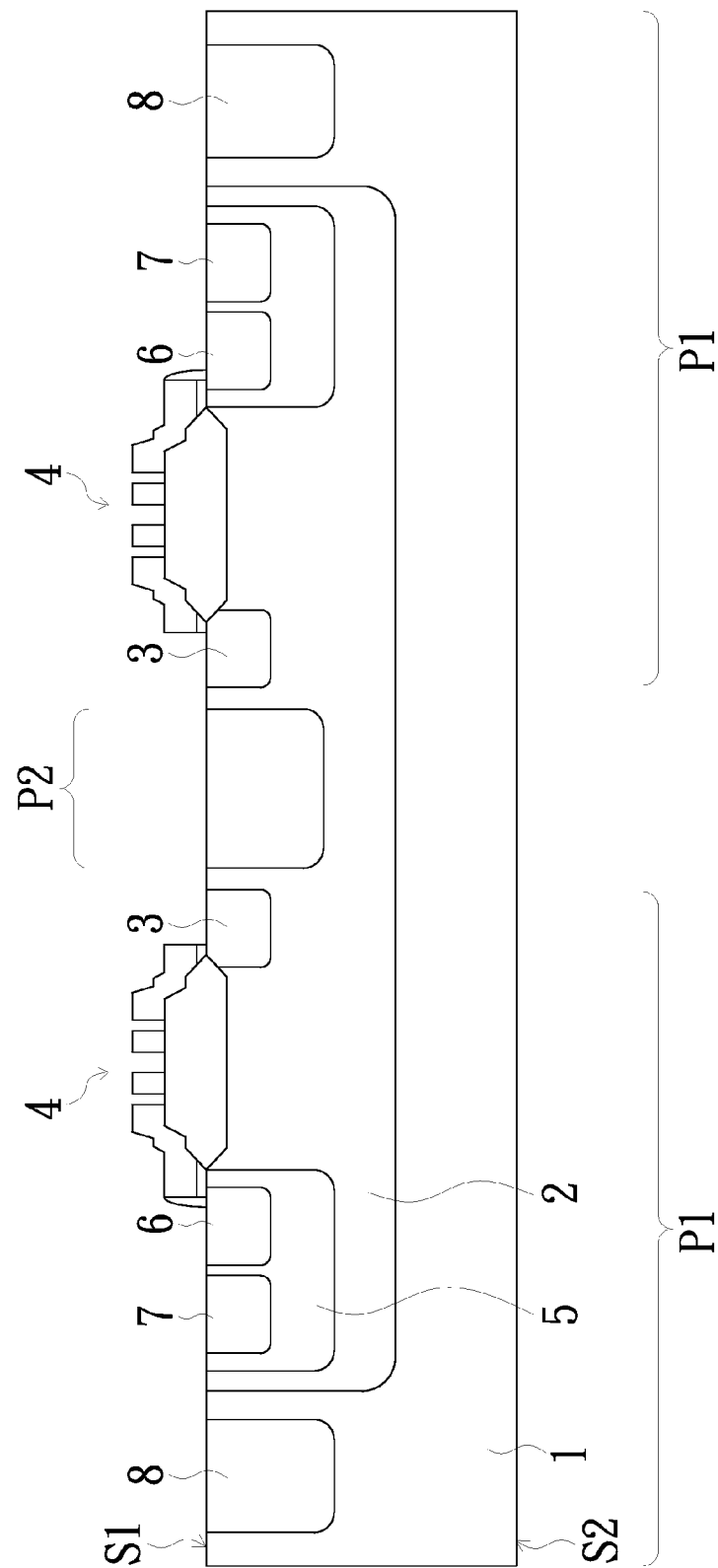
FIG. 1 is a schematic cross-sectional view of a semiconductor device of an embodiment of the present invention.
Figure 4:
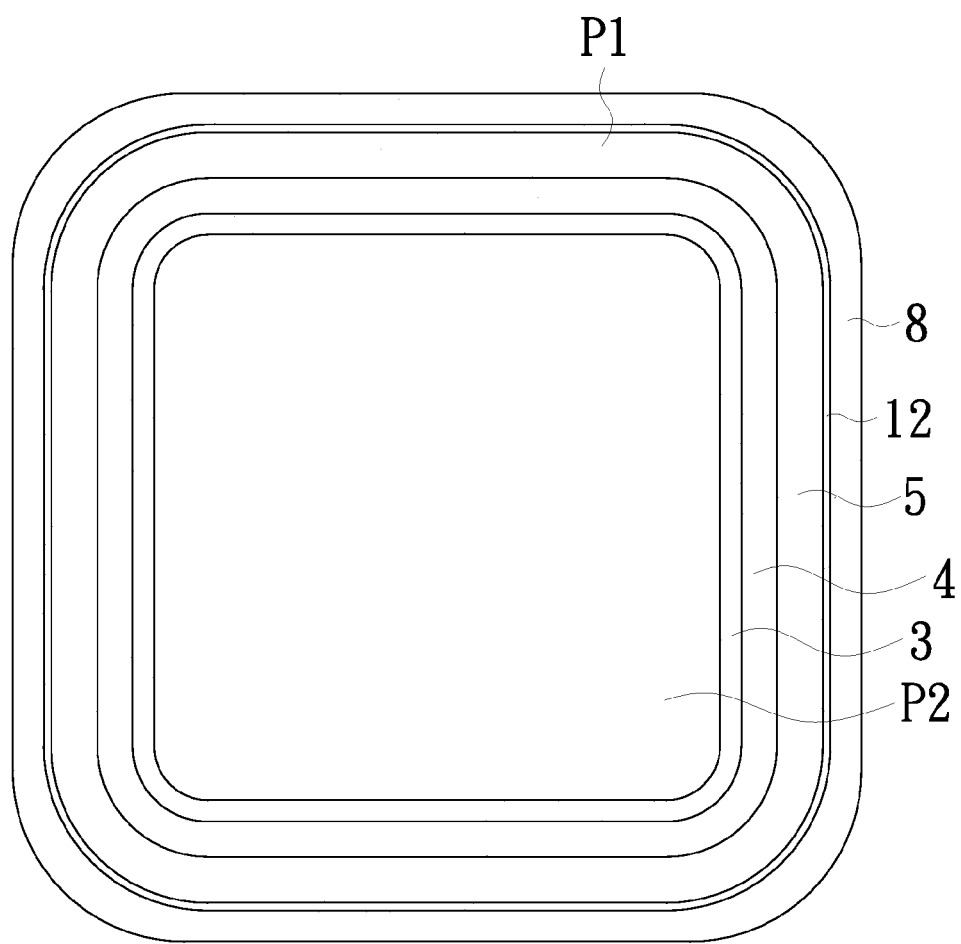
FIG. 4 is a schematic top view of the semiconductor device according to FIG. 3.

Referring now to FIG. 1, which illustrates a cross-sectional view of a semiconductor device of an embodiment of the present invention. The semiconductor device includes a substrate 1 having a first surface S1 and a second surface S2, a deep well region 2, a drain region 3, a gate structure 4, a well region 5, a source region 6, a body contact region 7, and an annular doped region 8. As shown in FIG. 1 and FIG. 4, the deep well region 2 is disposed in the substrate 1. The drain region 3 is disposed in the substrate 1 and in the deep well region 2. The gate structure 4 is disposed on the first surface S1 of the substrate 1, adjacent to the deep well region 2, and surrounding the drain region 3. The well region 5 is disposed in the deep well region 2 and surrounding the gate structure 4. The source region 6 is disposed in the well region 5 and thereby also surrounding the gate structure 4. The body contact region 7 is disposed separately from the source region 6 in the well region 5 and surrounding the source region 6 and the gate structure 4. The annular doped region 8 is disposed separately from the deep well region 2 in the substrate 1 and surrounding the deep well region 2 which includes an element region P2, the drain region 3, the gate structure 4, the well region 5. Doping type of each of the aforementioned regions can be n-type or p-type and may be adjusted according to specific needs. For example, when the substrate 1 is p-type, the deep well region 2 would be n-type, the well region 5 would be p-type, the source region 6 and the drain region 3 would be n-type, the body contact region 7 would be p-type, and the annular doped region 8 would be p-type. The choice of doping types for semiconductor devices is well-known in the art and repetitious details are thus not provided herein.

Figure 2:
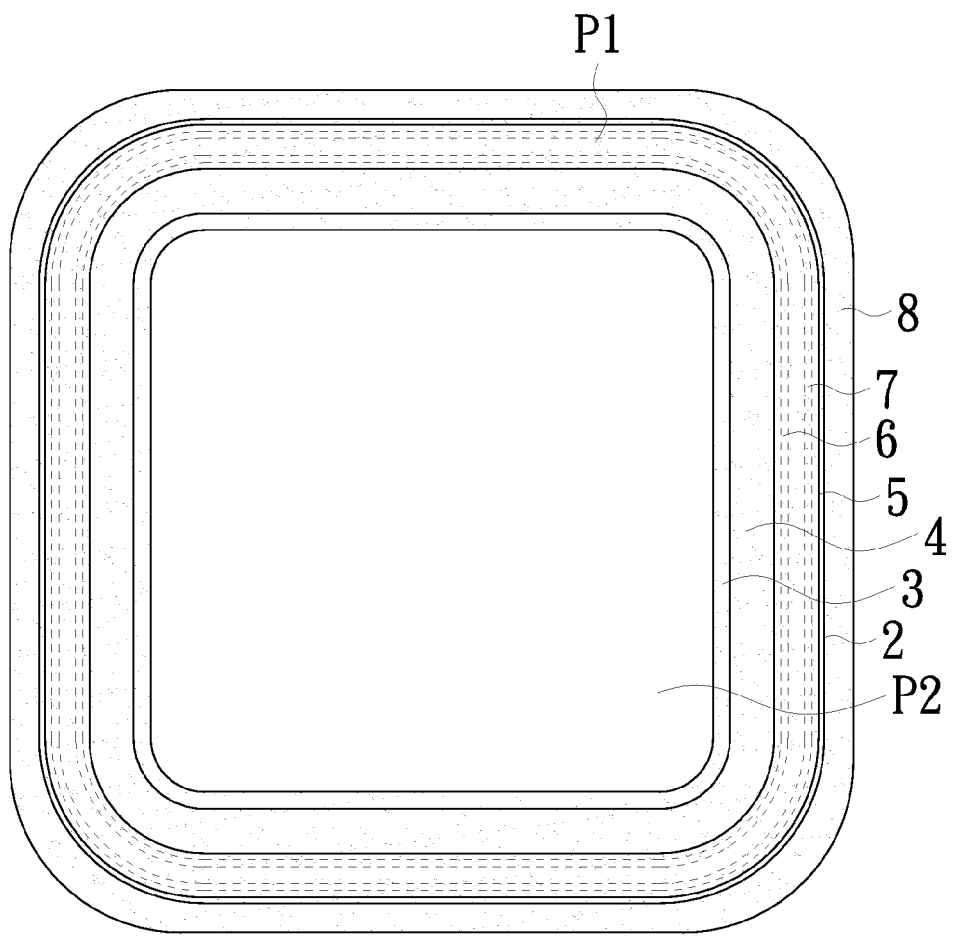
FIG. 2 is a schematic top view of the semiconductor device according to FIG. 1.

Under the structural concept of the present invention, the following example for the embodiment wherein the substrate 1 is p-type is given. As illustrated in FIG. 2, which is a top view of the semiconductor device according to FIG. 1, when the semiconductor device is utilized as a high-voltage-side device, the semiconductor device is configured into an off-state, an element region P2 located at the center of the substrate 1 forms a high-voltage-side region, and other regions of the semiconductor device form a guard ring P1. The element region P2 may include multiple elements, and the type and number of elements may be adjusted according to specific needs; and the guard ring P1 may include the drain region 3, the gate structure 4, the well region 5, the source region 6, the body contact region 7, and the annular doped region 8, and every above mentioned element is rotated 360 degrees surrounding the element region P2. For effective voltage reduction, the guard ring P1 includes the drain region 3, the gate structure 4, the deep well region 5, the source region 6, the body contact region 7, and the annular doped region 8. Under a standard operation, voltage difference occurs between the deep well region 2 and the well region 5 due to the presence of PN-junctions. However, in the present invention, both the source region 6 and the body contact region 7 located at the well region 5 are separated from each other, thus providing better device breakdown protection and more effective voltage reduction. Meanwhile, the separation between the source region 6 and the body contact region 7 prevents interference between the two regions caused by changes in doped ion distribution after long-term usage, and thus avoids other parasitic effects or device breakdown.

The semiconductor device structure provided in the present invention can sustain up to 800V of voltage. In high temperature reverse bias reliability (HTRB) tests, the inventors gave the element region P2 (high-voltage-side region) 700V of voltage and grounded the substrate 1 (including the body contact region 7 and the annular doped region 8), the source region 6, and the gate structure 4, the semiconductor device structure was shown to sustain 1000 hrs of HTRB tests.

The inventors also found that the source region 6 and the body contact region 7 can be given different voltages due to their physical separation. When the body contact region 7 and the annular doped region 8 were grounded, the source region 6 and the gate structure 4 were provided a positive voltage lower than or equal to 30V, and the drain region 3 was configured into a floating state, the channel could be turned on and reversely conducted the semiconductor device. The semiconductor device was then configured into an on-state to raise voltage at the drain region 3, so that the drain region 3 generated a positive voltage lower than the voltage provided for the source region 6, and therefore produced an effect of a bootstrap diode. Current semiconductor wafers have been known to externally connect with bootstrap diodes; however, the semiconductor device structure provided in the present invention not only solves voltage sustainability and stability issues common in high-voltage-side devices, but also integrates bootstrap diode functions into the semiconductor device.

Figure 3:
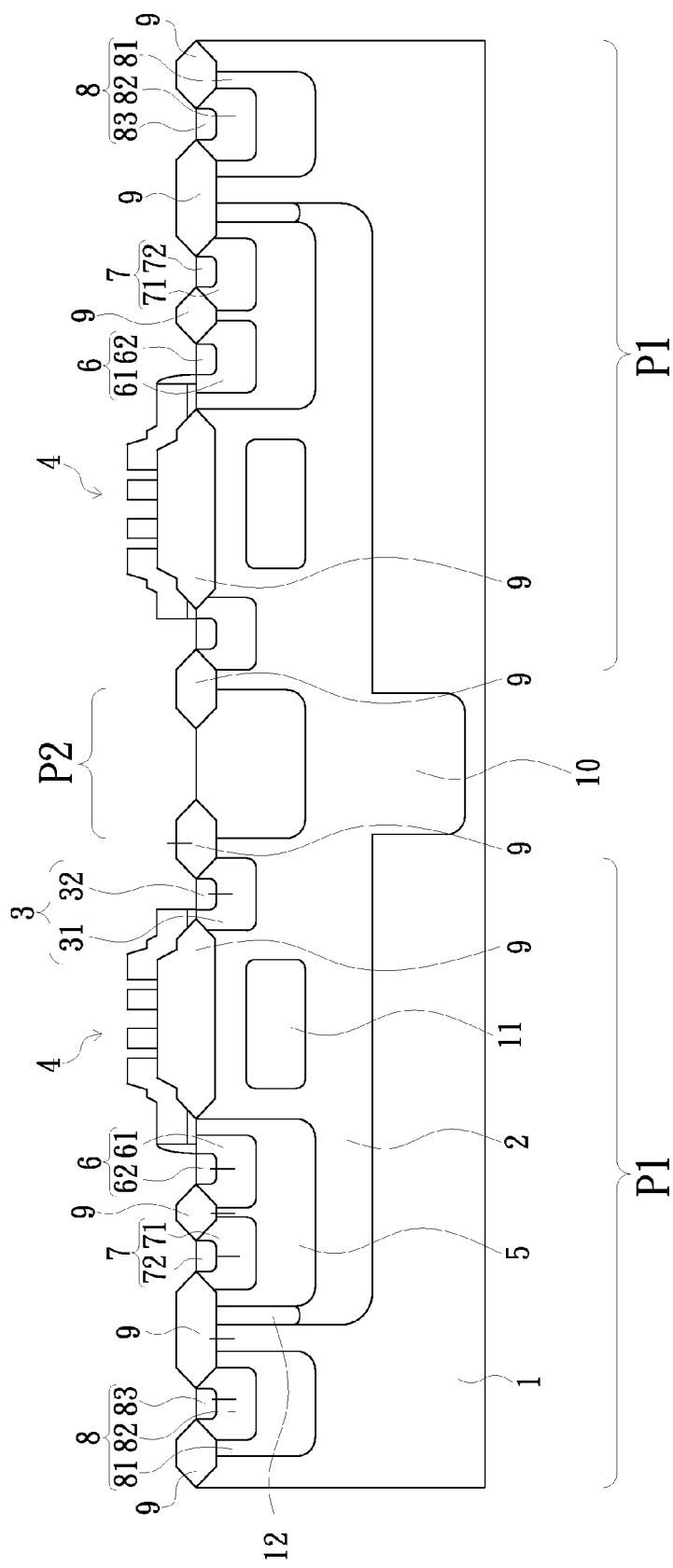
FIG. 3 is a schematic cross-sectional view of another embodiment of the semiconductor device of the present invention.

Referring now to FIG. 3, which illustrates the cross-sectional view of another embodiment of the semiconductor device of the present invention. Some detailed structural features adoptable in actual implementations are provided in addition to the basic structure of the embodiment illustrated in FIG. 1. Structural features of the another embodiment in FIG. 3 that are identical to those shown in FIG. 1 are labeled with the same numberings for simplification.

Figure 5:
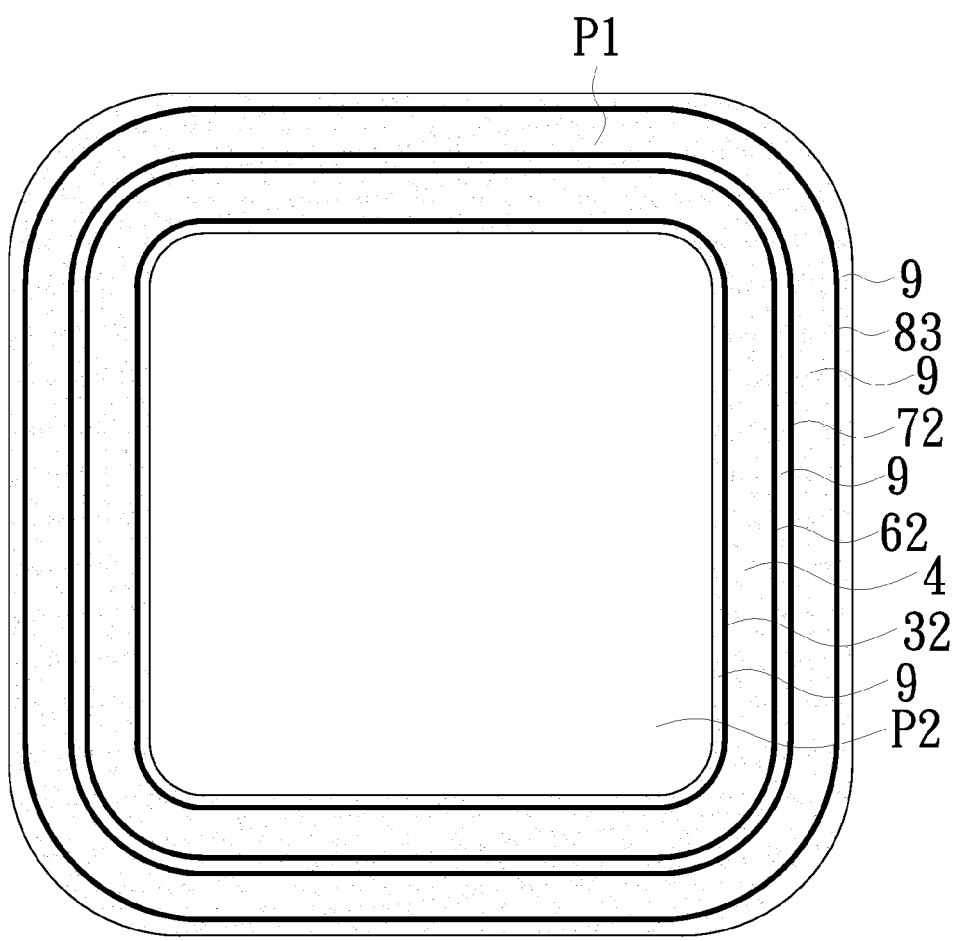
FIG. 5 is a more detail schematic top view of the semiconductor device according to FIG. 3.

As shown in FIG. 1, the substrate 1 includes a first surface S2 and a second surface S2; the deep well region 2 is disposed in the substrate 1; the element region P2 is disposed in the substrate 1 and in the deep well region 2; and the drain region 3 is also disposed in the substrate 1, in the deep well region 2 and surrounding the element region P2. In another embodiment, the element region P2 may include different required elements according to specific needs and no redundant detail is to be given herein. Refer to FIG. 3 ~5, the drain region 3 includes a lightly doped drain region 31 and a drain contact region 32 disposed in the lightly doped drain region 31 and surrounding the element region P2. The element region P2 and the drain region 3 are separated by an isolation structure 9. The gate structure 4 is disposed on the first surface S1 of the substrate 1, adjacent to the deep well region 2, and surrounding the drain region 3. The well region 5 is disposed in the deep well region 2 in the substrate 1 and surrounding the gate structure 4. In this embodiment, the gate structure 4 includes the isolation structure 9, side wall (not shown), gate dielectric layer (not shown), high dielectric constant layer (not shown), and gate electrode (not shown); the detailed elements in the gate structure 4 may vary by different manufacturing processes but may be adjusted according to actual needs.

Referring again to FIG. 3-5, the source region 6 is disposed in the well region 5 in the substrate 1 and surrounding the gate structure 4. In this embodiment, the source region 6 includes a doped source region 61 and a source contact region 62 disposed in the doped source region 61; the doped source region 61 and the source contact region 62 are both annular in shape and surround the gate structure 4. The body contact region 7 is separated from the source region 6 by the isolation structure 9 and is disposed in the well region 5 and surrounding the source region 6 and the gate structure 4; the body contact region 7 includes a lightly doped body contact region 71 and a doped body contact region 72 disposed in the lightly doped body contact region 71. The lightly doped body contact region 71 and the doped body contact region 72 are both annular in shape and thereby also surround the gate structure 4. An annular doped region 8 is disposed separately from the deep well region 2 in the substrate 1 and surrounding the deep well region 2; in this embodiment, the annular doped region 8 and the deep well region 2 are separated by the isolation structure 9. The annular doped region 8 includes an annular lightly doped region 81, an annular doped region 82 disposed in the annular lightly doped region 81, and an annular contact region 83 disposed in the annular doped region 82. The annular lightly doped region 81, the annular doped region 82, and the annular contact region 83 are all annular in shape and thereby also surround the deep well region 2. In this embodiment, the isolation structure 9 is annular in shape and surrounding its adjacent doping region/element closer to the element region P2.

In this embodiment, the semiconductor device of the other embodiment further includes a deep well isolation region 10, a top well region 11, and a peripheral deep well region 12. The deep well isolation region 10 is disposed in the substrate 1, adjacent to and beneath the deep well region 2, and located below the element region P2; the horizontal coverage of the deep well isolation region 10 corresponds to the element region P2. When the element region P2 forms a high-voltage-side region, vertical punch-through of voltages at the high-voltage-side region may be effectively avoided during operation. The top well region 11 is annular in shape, and is disposed in the deep well region 2, surrounding the element region P2, and covered by the gate structure 4. Doping type of the top well region 11 is different from that of the deep well region 2; the disposition of the top well region 11 provides functions resembling a capacitor and thus improves voltage reduction of the semiconductor device. While the top well region 11 is separated from the gate structure 4 in this embodiment, the top well region 11 may be in contact with the gate structure 4 in other embodiments (not shown in figures). The peripheral deep well region 12 is disposed in the deep well region 2 and adjacent to the well region 5, and surrounding the well region 5. Doping type of the peripheral deep well region 12 is identical to that of the deep well region 2 and different from that of the well region 5. The presence of the peripheral deep well region 12 may effectively avoid horizontal punch-through of voltages.

Referring again to FIG. 4, which illustrates the top view of the semiconductor device according to the aforementioned embodiment. The guard ring P1 includes the drain region 3, the gate structure 4, the well region 5, the source region 6, the body contact region 7, and the annular doped region 8, and every above mentioned doping regions and elements are rotated 360 degrees and surround the element region P2. In this embodiment, the substrate 1 is p-type, the deep well region 2 is n-type, the well region 5 is p-type, the source region 6 and the drain region 3 are n-type, the body contact region 7 is p-type, the annular doped region 8 is p-type, the deep well isolation region 10 is n-type, the top well region 11 is p-type, and the peripheral deep well region 12 is n-type. In terms of the doping concentration, the concentration at the body contact region 7 ranges from $1 \times 10^{13}$ to $1 \times 10^{15}$ dopant atoms per $cm^3$, with the lightly doped body contact region 71 being around $1 \times 10^{13}$ dopant atoms per $cm^3$ and the doped body contact region 72 being around $1 \times 10^{15}$ dopant atoms per $cm^3$; the concentration at the source region 6 ranges from $1 \times 10^{13}$ to $1 \times 10^{15}$ dopant atoms per $cm^3$, with the doped source region 61 being around $1 \times 10^{13}$ dopant atoms per $cm^3$ and the source contact region 62 being around $1 \times 10^{15}$ dopant atoms per $cm^3$; the concentration at the drain region 3 ranges from $1 \times 10^{13}$ to $1 \times 10^{15}$ dopant atoms per $cm^3$, with the lightly doped drain region 31 being around $1 \times 10^{13}$ dopant atoms per $cm^3$ and the drain contact region 32 being around $1 \times 10^{15}$ dopant atoms per $cm^3$; the doping concentration at the peripheral deep well region 12 is around $1 \times 10^{12}$ dopant atoms per $cm^3$; the doping concentration at the well region 5 is around $1 \times 10^{13}$ dopant atoms per $cm^3$; the doping concentration at the deep well region 2 is around $1 \times 10^{12}$ dopant atoms per $cm^3$; and the doping concentration at the top well region 11 is around $1 \times 10^{12}$ dopant atoms per $cm^3$. The doping concentration at the annular contact region 83 is higher than that at the annular doped region 82, and the doping concentration at the annular doped region 82 is higher than that at the annular lightly doped region 81.

The operating method of the aforementioned embodiment is identical to the descriptions specified above for the embodiment. More specifically, voltages are provided for the element region P2, the drain contact region 32, the source contact region 62, the doped body contact region 72, and the annular contact region 83. It was demonstrated that the semiconductor device of the another embodiment could sustain 700V of voltage for up to 1000 hours of HTRB test.

According to the embodiments of semiconductor device and its operating method of the present invention as provided above, the semiconductor device can be a high-voltage-side device when configured into an off-state and provides high voltage sustainability and stability; on the other hand, the semiconductor device can possess built-in bootstrap diode function when configured into an on-state, therefore integrating bootstrap diode functions into the device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
    a substrate, having a first surface;
    a deep well region, disposed in the substrate;
    an element region, disposed in the substrate and in the deep well region;
    a drain region, disposed in the substrate, in the deep well region, and surrounding the element region;
    a gate structure, disposed on the first surface of the substrate, adjacent to the deep well region, and surrounding the drain region;
    a well region, disposed in the substrate, in the deep well region, and surrounding the gate structure;
    a source region, disposed in the substrate, in the well region, and surrounding the gate structure;
    a body contact region, disposed separately from the source region in the well region and surrounding the source region; and
    an annular doped region, disposed separately from the deep well region in the substrate and surrounding the deep well region.

2. The semiconductor device according to claim 1, wherein the drain region comprises:
    a lightly doped drain region, surrounding the element region; and
    a drain contact region, disposed in the light doped drain region.

3. The semiconductor device according to claim 1, further comprising:
    a plurality of isolation structures, disposed between the element region and the drain region.

4. The semiconductor device according to claim 1, further comprising:
    a deep well isolation region, disposed in the substrate adjacent to and beneath the deep well region, and located below the element region.

5. The semiconductor device according to claim 1, further comprising:
    a top well region, disposed in the deep well region and covered by the gate structure.

6. The semiconductor device according to claim 5, wherein the top well region is annular and surrounding the drain region.

7. The semiconductor device according to claim 5, wherein the top well region is in contact with the gate structure.

8. The semiconductor device according to claim 5, wherein the top well region is separated from the gate structure.

9. The semiconductor device according to claim 1, wherein the source region comprises:
    a doped source region; and
    a source contact region, disposed in the doped source region.

10. The semiconductor device according to claim 9, wherein the doped source region and the source contact region are annular and surrounding the gate structure.

11. The semiconductor device according to claim 1, wherein the source region and the body contact region are separated by an isolation structure.

12. The semiconductor device according to claim 1, wherein the body contact region comprises:
    a lightly doped body contact region; and
    a doped body contact region, disposed in the lightly doped body contact region.

13. The semiconductor device according to claim 12, wherein the lightly doped body contact region and the doped body contact region are annular and surrounding the gate structure.

14. The semiconductor device according to claim 1, wherein the annular doped region comprises:
    an annular lightly doped region;
    an annular doped region, disposed in the annular lightly doped region; and
    an annular contact region, disposed in the annular doped region.

15. The semiconductor device according to claim 1, further comprising:
    a peripheral deep well region, disposed in the deep well region adjacent to the well region and surrounding the well region.

16. The semiconductor device according to claim 1, wherein the semiconductor device is a high-voltage-side device.

17. An operating method for a semiconductor device, wherein the semiconductor device comprises a substrate having a first surface, a deep well region disposed in the substrate, an element region disposed in the substrate and in the deep well region, a drain region disposed in the substrate, in the deep well region, and surrounding the element region, a gate structure disposed on the first surface of the substrate, adjacent to the deep well region, and surrounding the drain region, a well region disposed in the substrate, in the deep well region, and surrounding the gate structure, a source region disposed in the substrate, in the well region, and surrounding the gate structure, a body contact region disposed separately from the source region in the well region and surrounding the source region, and an annular doped region disposed separately from the deep well region in the substrate and surrounding the deep well region, the operating method for a semiconductor device comprises the steps of
    providing a ground voltage for the body contact region and the annular doped region; and
    providing the ground voltage or a first power supply voltage for the source region and the gate structure.

18. The operating method for the semiconductor device according to claim 17, wherein when the ground voltage is provided for the source region and the gate structure instead of the first power supply, a second power supply voltage is provided for the drain region.

19. The operating method for the semiconductor device according to claim 18, wherein the second power supply voltage ranges between 500-800V.

20. The operating method for the semiconductor device according to claim 17, wherein when the first power supply voltage is provided for the source region and the gate structure instead of the ground voltage, the drain region is in a floating state.

21. The operating method for the semiconductor device according to claim 20, wherein the first power supply voltage ranges between 0-30V.

22. The operating method for the semiconductor device according to claim 21, wherein the drain region produces a positive voltage lower than the first power supply voltage.

\* \* \* \* \*